United States Patent [19]
Huang

[11] Patent Number: 6,150,073
[45] Date of Patent: Nov. 21, 2000

[54] DEGRADATION-FREE LOW-PERMITTIVITY DIELECTRICS PATTERNING PROCESS FOR DAMASCENE

[75] Inventor: Yimin Huang, Taichung Hsien, Taiwan

[73] Assignee: United Microelectronics Corp., Hsinchu, Taiwan

[21] Appl. No.: 09/111,505

[22] Filed: Jul. 7, 1998

[30]    Foreign Application Priority Data

May 22, 1998  [TW]  Taiwan ................................. 87107991

[51] Int. Cl.$^7$ ........................................................ G03F 7/00
[52] U.S. Cl. ........................ 430/313; 430/315; 430/317; 216/41
[58] Field of Search ................... 430/313, 315, 430/317; 216/41

[56]          References Cited

U.S. PATENT DOCUMENTS 5,565,384  10/1996  Havemann ............................ 437/228
5,759,906   6/1998  Lou ....................................... 438/623
5,930,639   7/1999  Schuele ................................ 438/396

*Primary Examiner*—Kathleen Duda
*Assistant Examiner*—Nicole Barreca
*Attorney, Agent, or Firm*—Thomas, Kayden, Horstemeyer & Risley

[57]           ABSTRACT

A degradation-free, low-permittivity dielectrics patterning process for damascene starts with provision of a substrate, wherein the substrate has a dielectric layer and a via plug formed on it. Then, a inter-metal dielectric layer and an insulating layer are formed in sequence on the dielectric layer. A hard mask layer is next formed on the insulating layer, and is subsequently patterned. An etching process is performed on the insulating layer and the inter metal dielectric layer by using the patterned hard mask layer as a mask to form a metal line trench and expose the via plug. The metal line trench is then filled with metal by forming a metal layer on the hard mask layer. A metal line in the shallow trench is formed by performing chemical mechanical polishing on the metal layer to expose the insulating layer, and then performing post-chemical mechanical polishing cleaning.

36 Claims, 4 Drawing Sheets

DEGRADATION-FREE LOW-PERMITTIVITY DIELECTRICS PATTERNING PROCESS FOR DAMASCENE

CROSS-REFERENCE TO RELATED APPLICATION

This application claims the priority benefit of Taiwan application serial no. 87107991, filed May 22, 1998.

BACKGROUND OF THE INVENTION

1. Field of the Invention

This invention relates to a process for fabricating interconnects, and more particularly, to a degradation-free, low-permissivity dielectrics patterning process for damascene. Conventional patterning process gives rise to degradation of the low-permissivity dielectric layer; the process of this invention lessens this degradation.

2. Description of Related Art

Conventionally, there are two methods for fabricating interconnects, wherein one method includes forming a metal layer electrically connected to a via, patterning the photoresist layer on the metal layer, performing an etching process on the metal layer, and depositing an inter-metal dielectric (IMD) layer to cover the patterned metal layer. The other conventional method includes a damascene process of forming a dielectric layer, patterning the dielectric layer, forming trenches by an etching process, and filling the trenches with metal.

In a damascene process, using low-permissivity dielectric as IMD can reduce the occurrence of parasitic capacitance between interconnects and the IMD layer, and it can further decrease the RC delay. The low-permissivity dielectric includes inorganic materials, such as HSQ and FSG, and organic materials, such as flare, SILK, and parylene.

FIGS. 1A to 1E are sectional views showing a conventional damascene process.

Referring to FIG. 1A, a dielectric layer 102 is formed on a planarized substrate 100, wherein the dielectric layer includes a via plug 103, such as tungsten, electrically connected to a conducting region (not shown) on the substrate 100. A low-permissivity IMD layer 104 is formed on the dielectric layer 102 and via plug 103. Then, a patterned photoresist layer 106 is formed on the IMD layer 104, wherein the pattern of the photoresist layer 106 exposes the area on the IMD layer 104 reserved for forming trenches.

Referring to FIG. 1B, an etching process, such as a reactive ion etching process (RIE), is performed on the IMD layer 104 by using photoresist layer 106 as a mask to from trenches 107 and expose the top of the via plug 103.

Referring to FIG. 1C, the photoresist layer 106 is stripped by a photoresist removal process, such as an oxygen plasma ashing process or a wet chemical removal process.

However, the photoresist removal process, such as an oxygen plasma ashing process or a wet chemical removal process, damages the side walls 105 of the IMD layer 104a, and sometimes even causes a jagged profile on the side walls 105. Furthermore, the low-permissivity dielectric material of the sidewalls 105 tends to absorb moisture after a photoresist removal process, such as an oxygen plasma ashing process or a wet chemical removal process. As a result, the material filled into the trench 107 in the follow-up metallization process doesn't attach to the side walls 105 well and this causes degradation.

Referring to FIG. 1D, a metal glue/barrier layer 108, conformal to the shape of the IMD layer 104a, is formed over the substrate 100 to increase the attachment between the metal layer formed in the follow-up process and other materials. Then, a metal layer 110 is deposited on the glue/barrier layer 108 and fills the trench 107.

Referring to FIG. 1E, the undesired metal layer 110 on the metal glue/barrier layer 108 is removed by a chemical mechanical polishing process (CMP) to expose the top of the IMD layer 104a. This forms a metal line 110a and a patterned metal layer. The metal line 110a is electrically connected to the via plug 103.

However, the liquid cleaner used in a follow-up post metal-CMP cleaning process sometimes reacts with the foregoing low-permissivity dielectric layer. Such a reaction increases the permissivity of the dielectric, and makes the surface 115 of the IMD layer 104a tend to absorb moisture, which further causes poor attachment between the IMD layer 104a and material formed on it.

SUMMARY OF THE INVENTION

It is therefore an objective of the present invention to provide a degradation-free, low-permissivity dielectric patterning process for damascene, in order to prevent a low-permissivity dielectric layer from being degraded by a wet chemical treatment for post metal CMP cleaning.

In accordance with the foregoing and other objectives of the present invention, a novel, degradation-free low-permissivity dielectrics patterning process for damascene starts with providing a substrate having a pre-formed dielectric layer with a via plug, and then forming an IMD layer, an insulating layer, and a hard mask layer in sequence. A photoresist layer is then formed on the hard mask layer and patterned to transfer a pattern onto the hard mask layer. The photoresist layer is removed by performing oxygen plasma ashing and a wet chemical treatment after an etching process is performed to expose the insulating layer. Another etching process is performed on the insulating layer and the IMD layer to expose the via plug by using the patterned hard mask layer as a mask, for forming trenches. A metal layer is next deposited into the trenches. The undesired metal on the hard mask layer and the hard mask layer are removed by a CMP process, wherein the metal line filled into the trench is electrically connected to the via plug. Finally, a post metal CMP cleaning is carried out.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
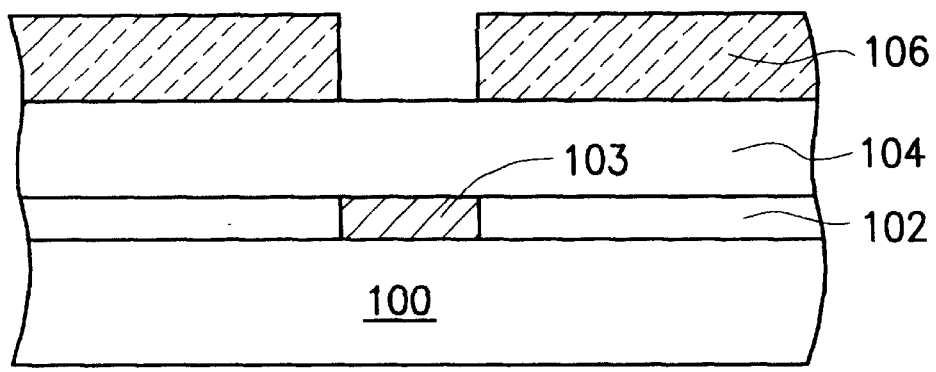
FIGS. 1A through 1E are cross-sectional views showing a conventional process for forming interconnects.
Figure 1B:
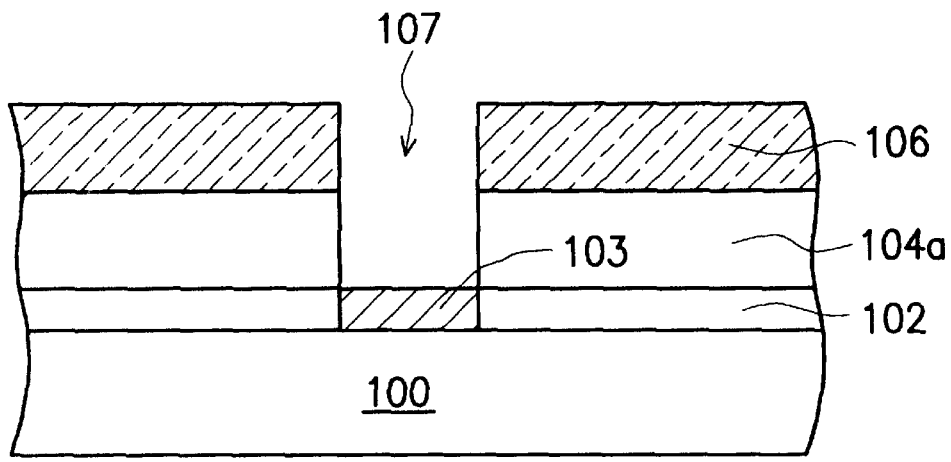
Figure 1C:
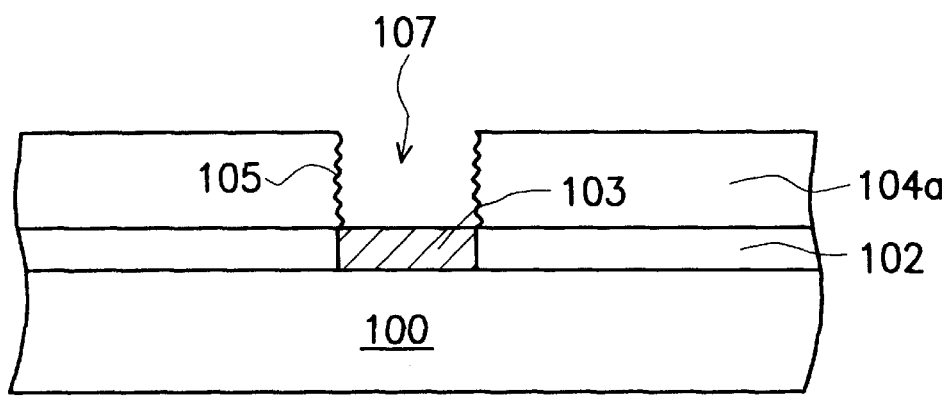
Figure 1D:
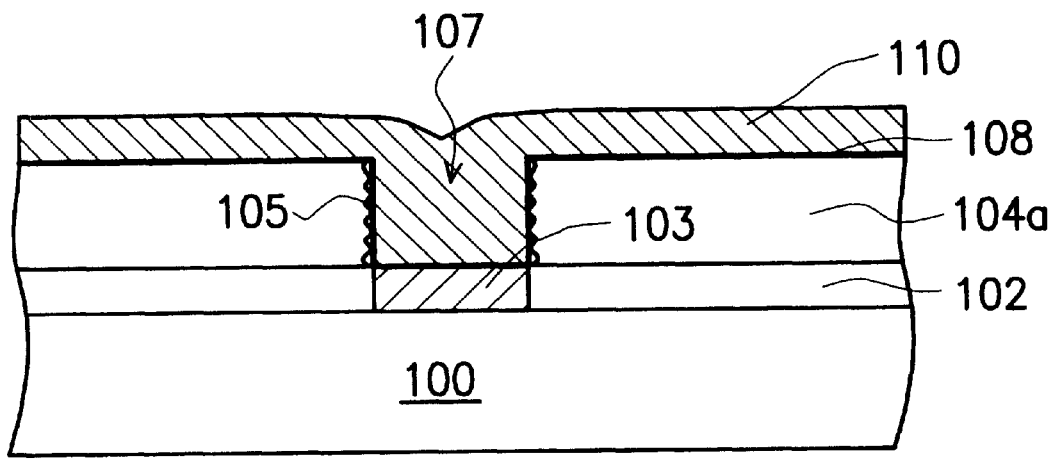
Figure 1E:
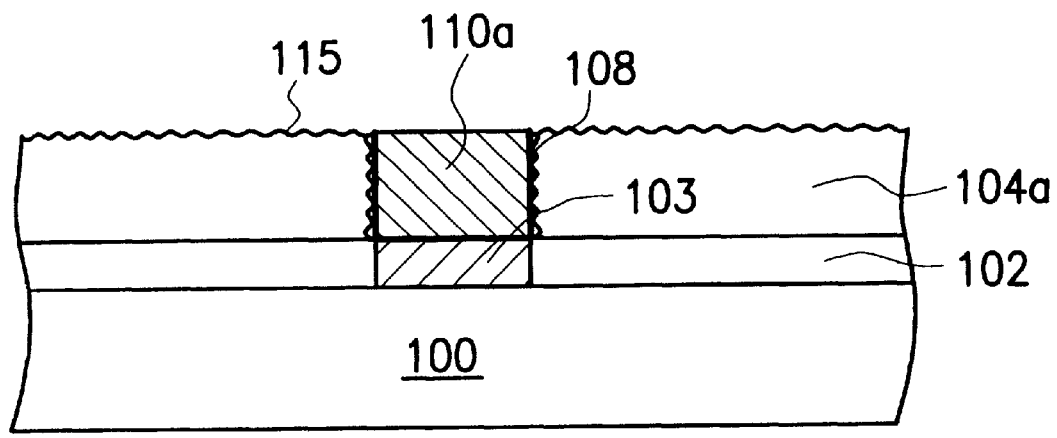
Figure 2A:
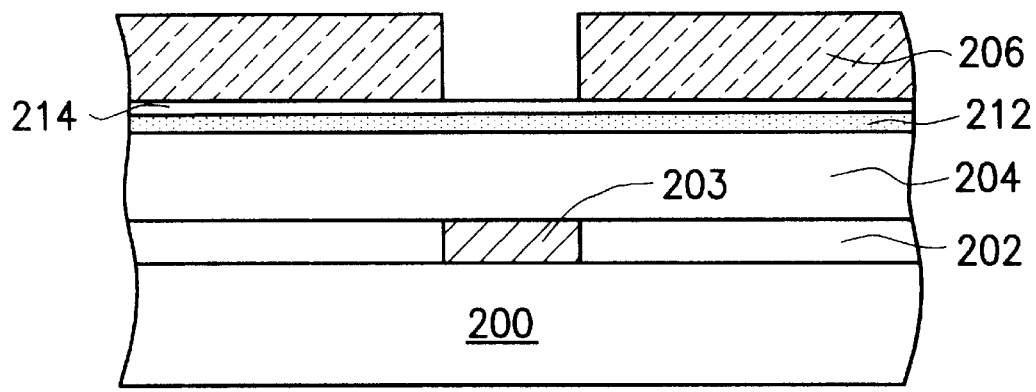
FIGS. 2A through 2F are cross-sectional views showing the degradation-free low-permissivity dielectrics patterning process for damascene in a preferred embodiment according to the invention.

The invention provides a degradation-free, low-permissivity dielectrics patterning process for damascene. Referring to FIG. 2A, a substrate 200 having a planarized surface (the contained devices are not shown in the figure), already has a dielectric layer 202 on it, wherein the dielectric layer 202 contains a via plug 203, such as a tungsten plug, electrically connected to a conducting region (not shown) of the substrate 200. A low-permissivity IMD layer 204 with a thickness of about 5000–7000 Å is formed to cover the dielectric layer 202 and the via plug 203. The IMD layer 204 preferably includes inorganic materials, such as HSQ and FSG, and organic materials, such as flare, SILK, and parylene.

An insulating layer 212, such as a silicon oxide layer with a thickness of about 2000 Å formed by CVD, is formed on the IMD layer 204. The insulating layer 212 is not only easier for the follow-up CMP than the IMD layer 204, but it can also protect the IMD layer 204 from being damaged by the CMP.

A hard mask layer 214, such as titanium, titanium nitride, tantalum, tantalum nitride, or tungsten nitride formed by chemical vapor deposition (CVD) or physical vapor deposition (PVD), is formed over the top of the IMD layer 204, wherein the thickness of the hard mask layer is about 300–500 Å.

A photoresist layer 206 is formed on the and mask layer 214 and partially exposes hard mask layer 214.

Figure 2B:
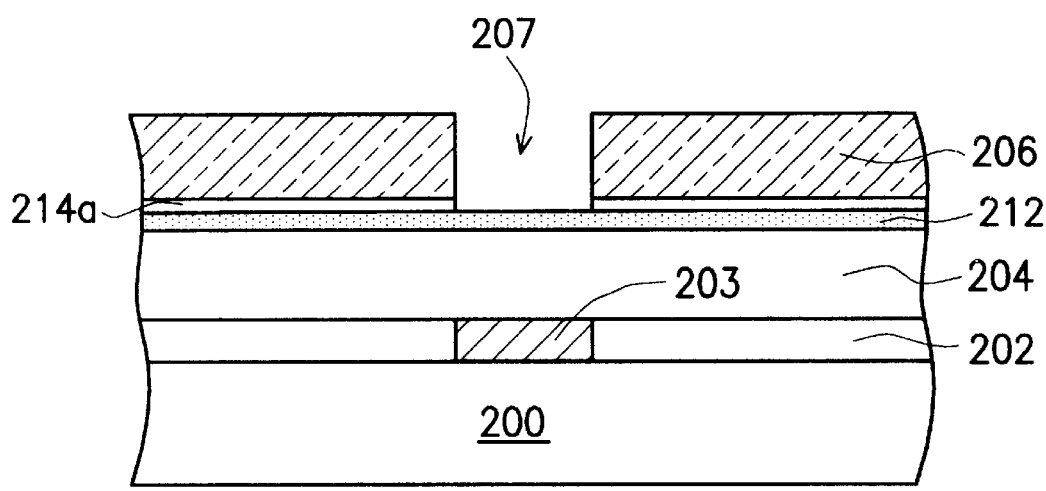

Referring to FIG. 2B, an etching process, such as a reactive ion etching (RIE), is performed on the hard mask layer 214 by using the photoresist layer 206 as a mask to form shallow trenches 207 on the hard mask layer 214a, and expose the insulating layer 212. The width of the shallow trench 207 is about the width of the trench for the metal line formed in a follow-up process.

Figure 2C:
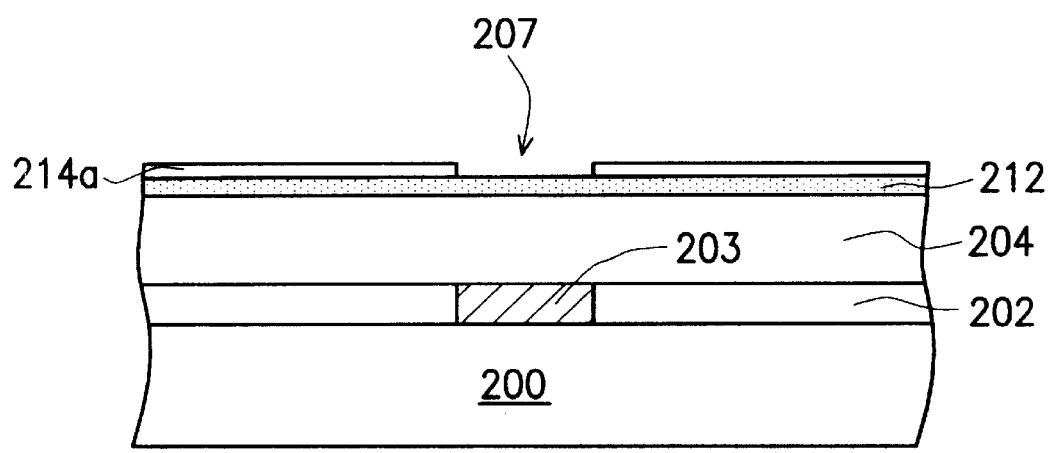

Referring to FIG. 2C, the photoresist layer 206 is stripped by a removal process, such as oxygen plasma ashing or wet chemical cleaning. Because of the protection from the insulating layer 212, the removal process, such as oxygen plasma ashing or wet chemical cleaning, used to remove the photoresist layer doesn't cause any damage, which otherwise might lead to degradation, on the IMD layer.

Figure 2D:
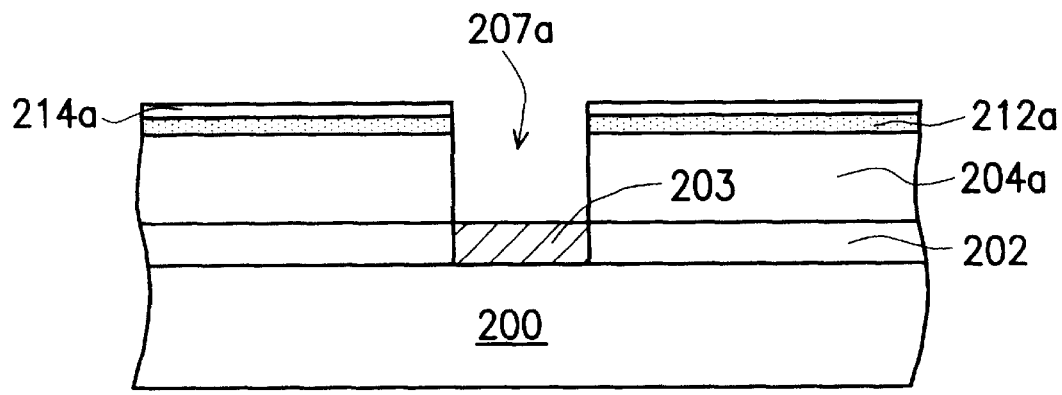

Referring to FIG. 2D, an etching process, such as RIE, is performed on the insulating layer 212 and the IMD layer 204 to form shallow trench 207a through the hard mask layer 214a, the insulating layer 212a, and the IMD layer 204a, and to expose the via plug 203. The shallow trench 207a is used to form a metal line in the follow-up damascene process.

Figure 2E:
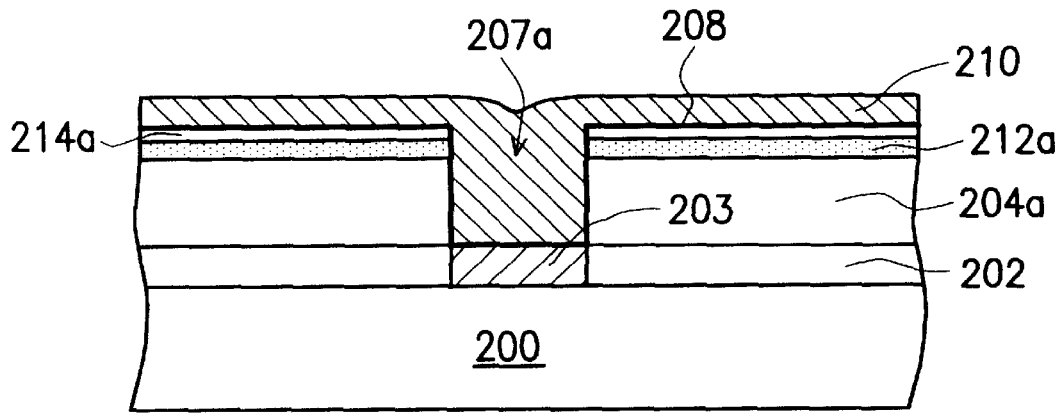

Referring to FIG. 2E, a glue/barrier layer 208, including titanium, titanium nitride, tantalum, tantalum nitride, or tungsten nitride formed by CVD or PVD, conformal to the surfaces of the hard mask layer 214a and the trench 207a, is used to improve the attachment of a metal layer formed by a follow-up process and other materials. Then, a metal layer 210, such as copper, aluminum, or aluminum-copper alloy, is formed on the glue/barrier layer 208, and filled into the shallow trench 207a.

Figure 2F:
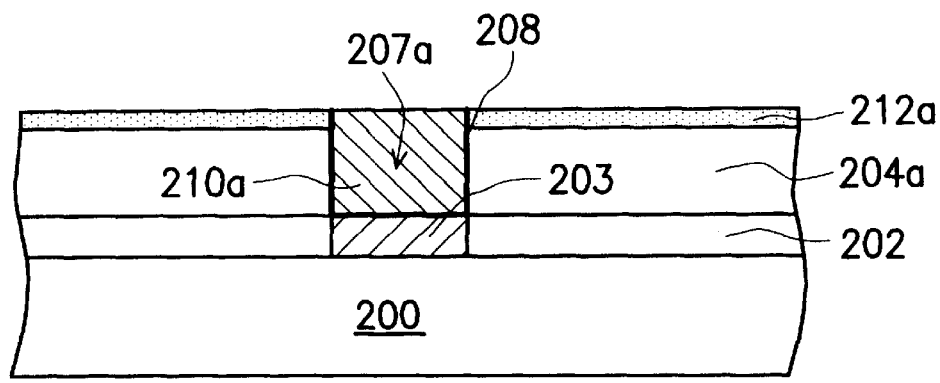

Referring to FIG. 2F, CMP is performed to remove the undesired metal layer 210 from the top of the glue/barrier layer 208 in order to expose the surface of the insulating layer 212a and form the metal line 210a. The thickness of the remaining insulating layer 212a is about 500–1000 Å. The metal line 210a is electrically connected to the via plug 203.

Because the IMD layer 204a is still covered by the insulating layer 212a, the low-permissivity IMD layer 204a is protected from being damaged by the liquid cleaner used in a post-CMP cleaning, and degradation is prevented.

In accordance with the foregoing the specifics of the invention include:

1. Because the IMD layer according to the invention is covered by an insulating layer and a hard mask layer, the damages on the IMD layer caused by the photoresist removal process and post-CMP cleaning process can be avoided.

2. The process according to the invention is compatible with existing semiconductor fabrication process, so it is convenient for industry to employ the process according to the invention.

The invention has been described using exemplary preferred embodiments. However, it is to be understood that the scope of the invention is not limited to the disclosed embodiments. On the contrary it is intended to cover various modifications and similar arrangements. The scope of the claims, therefore, should be accorded the broadest interpretation so as to encompass all such modifications and similar arrangements.

What is claimed is:

1. A degradation-free, low-permissivity dielectric patterning process for damascene, the process comprising:

providing a substrate, wherein the substrate has a dielectric layer and a via plug formed on it;

forming an inter-metal dielectric layer on the dielectric layer, wherein the inter-metal dielectric layer has a thickness;

forming an insulating layer on the inter-metal dielectric layer for protecting the inter-metal dielectric layer from being damaged by a photoresist removal process and a post-chemical mechanical polishing cleaning process, wherein the insulating layer has a thickness and the insulating layer is thinner than the inter-metal dielectric layer;

forming a hard mask layer on the insulating layer, wherein the hard mask layer has a thickness;

forming and patterning a photoresist layer on the hard mask layer to expose a portion of the hard mask layer;

performing an etching process on the hard mask layer until the insulating layer is exposed to form a shallow trench;

performing oxygen plasma ashing and wet chemical cleaning to remove the photoresist layer;

performing an etching process on the insulating layer and the inter-metal dielectric layer by using the hard mask layer as a mask to form a metal line trench and expose the via plug;

forming a glue/barrier layer conformal to the metal line trench and the hard mask layer;

forming a metal layer on the glue/barrier layer to fill the metal line trench;

performing chemical mechanical polishing on the metal layer to expose the insulating layer and form a metal line in the shallow trench, wherein the metal line is electrically connected to the via plug; and performing post-chemical mechanical polishing cleaning.

2. The process of claim 1, wherein the inter-metal dielectric layer includes HSQ, FSG, flare, SILK or parylene.

3. The process of claim 1, wherein the thickness of the inter-metal dielectric layer is about 5000–7000 Å.

4. The process of claim 1, wherein the insulating layer includes silicon oxide.

5. The process of claim 1, wherein the thickness of the insulating layer is about 2000 Å.

6. The process of claim 1, wherein the hard mask layer includes titanium, titanium nitride, tantalum, tantalum nitride, or tungsten nitride.

7. The process of claim 1, wherein the thickness of the hard mask layer is about 300–500 Å.

8. The process of claim 1, wherein the etching process performed on the hard mask layer includes reactive ion etching.

9. The process of claim 1, wherein the etching process performed on the insulating layer and the inter-metal dielectric layer includes reactive ion etching.

10. The process of claim 1, wherein the glue/barrier layer includes titanium, titanium nitride, tantalum, tantalum nitride, or tungsten nitride.

11. A degradation-free, low-permissivity dielectrics patterning process for damascene on a substrate, wherein the substrate has a dielectric layer and a via plug formed thereon, the process comprising:

forming an inter-metal dielectric layer on the dielectric layer, wherein the inter-metal dielectric layer has a thickness;

forming an insulating layer on the inter-metal dielectric layer, wherein the insulating layer has a thickness, and the insulating layer is thinner than the inter-metal dielectric layer;

forming a hard mask layer on the insulating layer, wherein the hard mask layer has a thickness;

patterning the hard mask layer to form a shallow trench and expose the insulating layer;

performing an etching process on the insulating layer and the inter-metal dielectric layer by using the hard mask layer as a mask to form a metal line trench and expose the via plug;

forming a metal layer on the hard mask layer to fill the metal line trench; and performing chemical mechanical polishing on the metal layer to expose the insulating layer and form a metal line in the shallow trench, wherein the metal line is electrically connected to the via plug.

12. The process of claim 11, wherein the inter-metal dielectric layer includes HSQ, FSG, flare, SILK or parylene.

13. The process of claim 11, wherein the thickness of the inter-metal dielectric layer is about 5000–7000 Å.

14. The process of claim 11, wherein the insulating layer includes silicon oxide.

15. The process of claim 11, wherein the thickness of the insulating layer is about 2000 Å.

16. The process of claim 11, wherein the hard mask layer includes titanium, titanium nitride, tantalum, tantalum nitride, or tungsten nitride.

17. The process of claim 11, wherein the thickness of the hard mask layer is about 300–500 Å.

18. The process of claim 11, wherein the steps of patterning the hard mask layer comprise:

forming a photoresist layer on the hard mask layer, wherein the photoresist layer exposes a portion of the hard mask layer;

performing an etching process to form the shallow trench and expose the insulating layer; and removing the photoresist layer by oxygen plasma ashing and wet chemical cleaning.

19. The process of claim 18, wherein the etching process performed on the hard mask layer includes reactive ion etching.

20. The process of claim 11, wherein the etching process performed on the insulating layer and the inter-metal dielectric layer includes reactive ion etching.

21. The process of claim 11, wherein the steps of forming the metal layer further comprises forming a glue/barrier layer conformal to the hard mask layer and the metal line trench.

22. The process of claim 21, wherein the glue/barrier layer includes titanium, titanium nitride, tantalum, tantalum nitride, or tungsten nitride.

23. The process of claim 11, further comprising a post-chemical mechanical polishing cleaning after the step of performing the chemical-mechanical polishing.

24. A degradation-free, low-permissivity dielectrics patterning process for damascene on a substrate, wherein the substrate has a dielectric layer and a via plug formed thereon, the process comprising:

forming an inter-metal dielectric layer on the dielectric layer, wherein the inter-metal dielectric layer has a thickness;

forming an insulating layer on the inter-metal dielectric layer, wherein the insulating layer has a thickness and the insulating layer is thinner than the inter-metal dielectric layer;

forming a hard mask layer on the insulating layer, wherein the hard mask layer has a thickness;

patterning the hard mask layer to form a shallow trench and expose a portion of the inter-metal dielectric layer;

performing an etching process on the insulating layer and the inter-metal dielectric layer by using the hard mask layer as a mask to form a metal line trench and expose the via plug;

forming a metal layer on the hard mask layer to fill the metal line trench; and performing an etching process on the metal layer to expose the insulating layer and form a metal line in the shallow trench, wherein the metal line is electrically connected to the via plug.

25. The process of claim 24, wherein inter-metal dielectric layer includes HSQ, FSG, flare, SILK or parylene.

26. The process of claim 24, wherein the thickness of the inner-metal dielectric layer is about 5000–7000 Å.

27. The process of claim 24, wherein the insulating layer includes silicon oxide.

28. The process of claim 24, wherein the thickness of the insulating layer is about 2000 Å.

29. The process of claim 24, wherein the hard mask layer includes titanium, titanium nitride, tantalum, tantalum nitride, or tungsten nitride.

30. The process of claim 24, wherein the thickness of the hard mask layer is about 300–500 Å.

31. The process of claim 24, wherein the steps of patterning the hard mask layer comprise:

forming a photoresist layer on the hard mask layer, wherein the photoresist layer exposes a portion of the hard mask layer;

performing an etching process to form the shallow trench and expose the insulating layer; and removing the photoresist layer by oxygen plasma ashing and wet chemical cleaning.

32. The process of claim 31, wherein the etching process performed on the hard mask layer includes reactive ion etching.

33. The process of claim 24, wherein the etching process performed on the inter-metal dielectric layer includes reactive ion etching.

34. The process of claim 24, wherein the steps of forming the metal layer further comprise forming a glue/barrier layer conformal to the hard mask layer and the metal line trench, wherein the glue/barrier layer further has contact with the dielectric layer.

35. The process of claim 34, wherein the glue/barrier layer includes titanium, titanium nitride, tantalum, tantalum nitride, or tungsten nitride.

36. The process of claim 24, wherein the etching process performed on the metal layer above the hard mask layer comprises performing chemical mechanical polishing and post-chemical mechanical polishing cleaning.

* * * * *